United States Patent
Feng et al.

(10) Patent No.: US 10,985,258 B2
(45) Date of Patent: Apr. 20, 2021

(54) METHOD FOR PREPARING DIAMOND-BASED FIELD EFFECT TRANSISTOR, AND CORRESPONDING FIELD EFFECT TRANSISTOR

(71) Applicant: THE 13TH RESEARCH INSTITUTE OF CHINA ELECTRONICS TECHNOLOGY GROUP CORPORATION, Hebei (CN)

(72) Inventors: Zhihong Feng, Shijiazhuang (CN); Jingjing Wang, Shijiazhuang (CN); Cui Yu, Shijiazhuang (CN); Chuangjie Zhou, Shijiazhuang (CN); Jianchao Guo, Shijiazhuang (CN); Zezhao He, Shijiazhuang (CN); Qingbin Liu, Shijiazhuang (CN); Xuedong Gao, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 0 days.

(21) Appl. No.: 16/644,233

(22) PCT Filed: Nov. 6, 2017

(86) PCT No.: PCT/CN2017/109532
§ 371 (c)(1),
(2) Date: Mar. 4, 2020

(87) PCT Pub. No.: WO2019/047356
PCT Pub. Date: Mar. 14, 2019

(65) Prior Publication Data
US 2021/0066471 A1    Mar. 4, 2021

(30) Foreign Application Priority Data
Sep. 5, 2017 (CN) .......................... 201710792114.8

(51) Int. Cl.
*H01L 29/66* (2006.01)
*H01L 29/16* (2006.01)
*H01L 29/786* (2006.01)

(52) U.S. Cl.
CPC .... *H01L 29/66045* (2013.01); *H01L 29/1602* (2013.01); *H01L 29/78684* (2013.01)

(58) Field of Classification Search
CPC .......... H01L 29/1602; H01L 29/66045; H01L 29/78684
See application file for complete search history.

(56) References Cited

U.S. PATENT DOCUMENTS

| 6,025,211 | A | 2/2000 | Ishikura |
| 9,349,801 | B2 | 5/2016 | Brezeanu et al. |

(Continued)

FOREIGN PATENT DOCUMENTS

| CN | 103325686 A | 9/2013 |
| CN | 104865305 A | 8/2015 |

(Continued)

OTHER PUBLICATIONS

International Search Report in the international application No. PCT/CN2017/109532, dated Jun. 8, 2018, 2 pgs.

(Continued)

*Primary Examiner* — Zandra V Smith
*Assistant Examiner* — Molly K Reida
(74) *Attorney, Agent, or Firm* — Slater Matsil, LLP

(57) ABSTRACT

Disclosed are a preparation method for a diamond-based field effect transistor and a field effect transistor, relating to the technical field of semi-conductors. Said method comprising: forming a conductive layer on the upper surface of a diamond layer; the diamond layer being a high-resistance layer; manufacturing an active region mesa on the diamond layer; manufacturing, on the conductive layer, a source electrode on a first region corresponding to a source electrode region, and manufacturing, on the conductive layer, a drain electrode on a second region corresponding to a drain electrode region; depositing, on the conductive layer, a photocatalyst dielectric layer on the upper surface of a third region corresponding to a source and gate region, and depositing, on the conductive layer, the photocatalyst dielec- (Continued)

tric layer on the upper surface of a fourth region corresponding to a gate and drain region; illuminating the photocatalyst dielectric layer; depositing, on the conductive layer, a gate dielectric layer on a fifth region corresponding to gate electrode region, manufacturing a gate electrode on the upper surface of the gate dielectric layer. The present invention can reduce the on-resistance of devices.

10 Claims, 3 Drawing Sheets

(56) References Cited

U.S. PATENT DOCUMENTS

| | | |
|---|---|---|
| 9,759,680 B2 | 9/2017 | Brezeanu et al. |
| 2016/0056239 A1 | 2/2016 | Brezeanu et al. |
| 2016/0238552 A1 | 8/2016 | Brezeanu et al. |

FOREIGN PATENT DOCUMENTS

| | | | |
|---|---|---|---|
| CN | 104992975 A | * | 10/2015 |
| CN | 106783558 A | | 5/2017 |
| CN | 106981512 A | | 7/2017 |

OTHER PUBLICATIONS

English translation of the Written Opinion of the International Search Authority in the international application No. PCT/CN2017/109532, dated Jun. 8, 2018, 3 pgs.

\* cited by examiner

METHOD FOR PREPARING DIAMOND-BASED FIELD EFFECT TRANSISTOR, AND CORRESPONDING FIELD EFFECT TRANSISTOR

TECHNICAL FIELD

The disclosure relates to the technical field of semiconductors, and particularly to a method for preparing a diamond-based field effect transistor, and a corresponding field effect transistor.

BACKGROUND

Devices made from materials based on monocrystal, polycrystal and nano-crystal diamonds are all called diamond-based devices, such as metal semiconductor field effect transistor (MESFET), metal insulating field effect transistor (MISFET) and junction field effect transistor (JFET). The diamond-based device has advantages such as a high working temperature, a high breakdown field strength, a high cut-off frequency, a high power density, and is a best choice in the field of future high-power microwave devices.

SUMMARY

Technical Problem

As a wide band gap semiconductor, diamond has some problems such as difficulty in doping, difficulty in activation due to high activation energy of dopant atoms, a low migration rate of carriers. A current method for preparing an efficient p-type conductive channel includes: forming a hydrogen terminated diamond covered by C—H bonds on a surface of a diamond by surface processing, and using mutual interactions between the C—H bonds and polar molecules, such as water molecules and $CO_2$ molecules, in a near-surface absorption layer in the air to form the p-type conductive channel in the near-surface via electron transfer. But the absorption layer that provides acceptors in the near-surface is mainly provided by the air in the environment, which makes the near-surface system susceptible to the environment and vulnerable. Particularly when a diamond-based device is working in high temperature, the polar molecules will be desorbed and escape from the near-surface of the diamond, which causes a poor performance of the p-type channel, even renders the channel invalid, and thus results in an increase in the on-resistance of the field effect transistor.

Technical Solutions

In view of the above, i embodiments of the disclosure provide a method for preparing a diamond-based field effect transistor, and a field effect transistor, so as to solve the technical problem in the prior art that the diamond-based field effect transistor has a large on-resistance.

A method for preparing a diamond-based field effect transistor is provided in a first aspect of the embodiments of the disclosure and the method includes the following operations:

a conductive layer is formed on an upper surface of a diamond layer which is a high-resistance layer;

an active region mesa is manufactured on the diamond layer;

a source electrode is manufactured on a first region of the conductive layer corresponding to a source region and a drain electrode is manufactured on a second region of the conductive layer corresponding to a drain region;

a photocatalyst dielectric layer is deposited on an upper surface of a third region of the conductive layer corresponding to a source-to-gate region and on an upper surface of a fourth region of the conductive layer corresponding to a gate-to-drain region;

the photocatalyst dielectric layers are illuminated;

a gate dielectric layer is deposited on a fifth region of the conductive layer corresponding to a gate region and a gate electrode is manufactured on an upper surface of the gate dielectric layer.

In a first possible implementation mode of the first aspect, the method further includes the following operation: before manufacturing the active region mesa on the diamond layer, a first metal layer is deposited on an upper surface of the conductive layer.

In combination with the first possible implementation mode of the first aspect, in a second possible implementation mode, manufacturing the active region mesa on the diamond layer specifically includes the following operations:

photoresist is applied over a region of the first metal layer corresponding to an active region using a photolithography process;

the first metal layer in a region corresponding to a passive region is removed using a corrosive liquid;

the conductive layer in the region corresponding to the passive region is removed using an etching process; and the photoresist is removed.

In combination with the second possible implementation mode of the first aspect, in a third possible implementation mode, the photoresist is applied over a region of the first metal layer other than regions corresponding to the source region and the drain region;

a second metal layer is deposited on an upper surface of a region of the first metal layer corresponding to the first region to form the source electrode, and a second metal layer is deposited on an upper surface of a region of the first metal layer corresponding to the second region to form the drain electrode;

the photoresist is removed.

In combination with the third possible implementation mode of the first aspect, in a fourth possible implementation mode, depositing the gate dielectric layer on the fifth region of the conductive layer corresponding to the gate region is performed before depositing the photocatalyst dielectric layer on the upper surface of the third region of the conductive layer corresponding to the source-to-gate region; and depositing the gate dielectric layer on the fifth region of the conductive layer corresponding to the gate region and manufacturing the gate electrode on the upper surface of the gate dielectric layer specifically includes the following operations:

the first metal layer in regions corresponding to the source-to-gate region, the gate region and the gate-to-drain region is removed;

the gate dielectric layer is deposited on an upper surface of the fifth region of the conductive layer; and a third metal layer is deposited on an upper surface of the gate dielectric layer to form the gate electrode.

In combination with the fourth possible implementation mode of the first aspect, in a fifth possible implementation mode, depositing the photocatalyst dielectric layer on the upper surface of the third region of the conductive layer corresponding to the source-to-gate region and depositing the photocatalyst dielectric layer on the upper surface of the fourth region of the conductive layer corresponding to the gate-to-drain region specifically includes the following operations:

the photocatalyst dielectric layer is deposited;

photoresist is applied over both regions of the photocatalyst dielectric layer corresponding to the source-to-gate region and corresponding to the gate-to-drain region;

the photocatalyst dielectric layers in regions corresponding to the source region, the drain region, the gate region and the passive region is removed respectively; and the photoresist is removed.

In a sixth possible implementation mode of the first aspect, manufacturing the active region mesa on the diamond layer specifically includes the following operations:

photoresist is applied over a region of the conductive layer corresponding to the active region;

the conductive layer in a region corresponding to a passive region is removed to form the active region mesa; and the photoresist is removed.

In a seventh possible implementation mode of the first aspect, manufacturing the source electrode on the first region of the conductive layer corresponding to the source region and manufacturing the drain electrode on the second region of the conductive layer corresponding to the drain region specifically include the following operations:

photoresist is applied over a region other than the first region and the second region using a photolithography process.

a second metal layer is deposited on the upper surface of the first region to form the source electrode and the second metal layer is deposited on the upper surface of the second region to form the drain electrode;

the photoresist is removed;

an annealing process is used to form an ohmic contact between the conductive layer corresponding to the source region and the second metal layer and an ohmic contact between the conductive layer corresponding to the drain region and the second metal layer.

In an eighth possible implementation mode of the first aspect, depositing the gate dielectric layer on the fifth region of the conductive layer and manufacturing the gate electrode on the upper surface of the gate dielectric layer specifically includes the following operations:

photoresist is applied over a region of the conductive layer other than the fifth region;

the gate dielectric layer is deposited on an upper surface of the fifth region;

a third metal layer is deposited on the upper surface of the gate dielectric layer; and the photoresist is removed.

A diamond-based field effect transistor provided in a second aspect of the embodiments of the disclosure includes a high-resistance diamond substrate, a conductive layer, a gate dielectric layer, a source electrode, a drain electrode and a gate electrode, an upper surface of the high-resistance diamond substrate being covered with the conductive layer, an upper surface of the conductive layer being provided with the source electrode, the drain electrode and the gate electrode, the gate dielectric layer being disposed between the gate electrode and the conductive layer; a photocatalyst dielectric layer is provided on a region of the conductive layer between the source electrode and the gate electrode and on a region of the conductive layer between the drain electrode and the gate electrode.

Beneficial Effects

The beneficial effects brought by adopting the above technical solutions are as follows. In the embodiments of the disclosure, a photocatalyst dielectric layer is deposited in a region between a source electrode and a gate electrode and a photocatalyst dielectric layer is deposited in a region between a drain electrode and the gate electrode. When the photocatalyst dielectric layers are illuminated, electrons in the valence band of the photocatalyst dielectric layers experience transition and then electrons and holes are generated; the electrons will combine with hydroxyls and water that are absorbed on a surface of the photocatalyst dielectric layer to form hydroxyl radicals, and the dissolved oxygen on the surface of the photocatalyst dielectric layer will also capture the electrons and form superoxide anions, thus causing surplus holes in the photocatalyst dielectric layer; the surplus holes will cause transfer of the electrons in the hydrogen terminated diamond by attracting the electrons and neutralize the electrons. Such a process accelerates the transfer of the electrons at an interface between the p-type conductive channel and the photocatalyst dielectric layer, thus ensures a steady and continuous supply of charges for the hydrogen terminated diamond and a much better performance of the p-type conductive channel Therefore, it is possible to reduce the on-resistance of the diamond-based field effect transistor.

BRIEF DESCRIPTION OF THE DRAWINGS

Description of the Drawings

Figure 1:
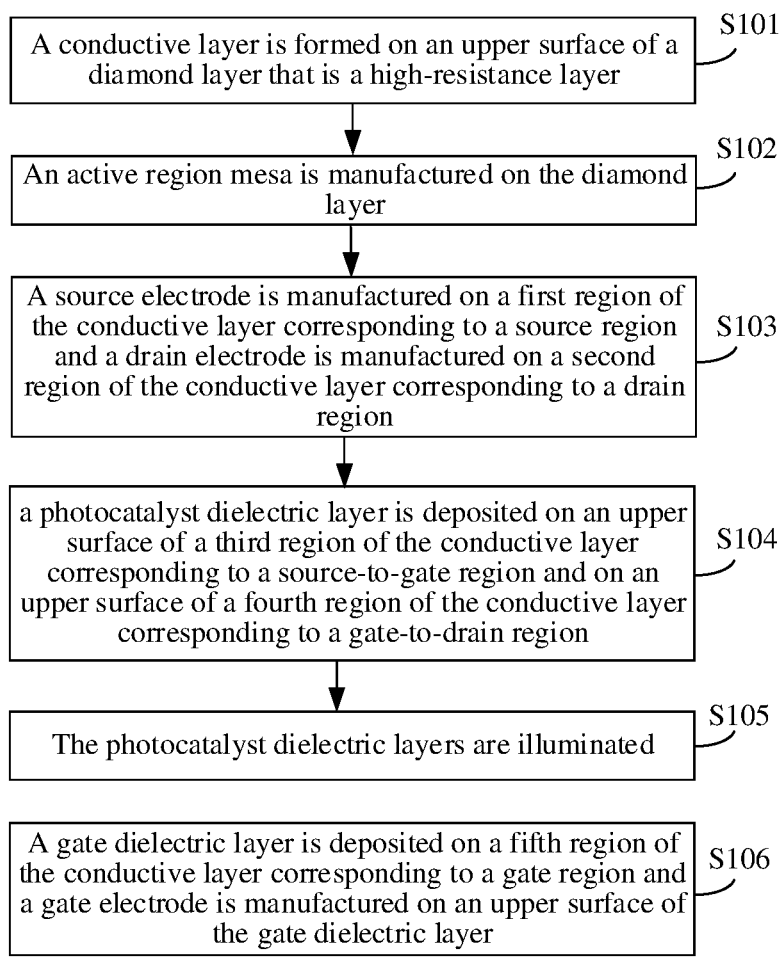
Figure 2:
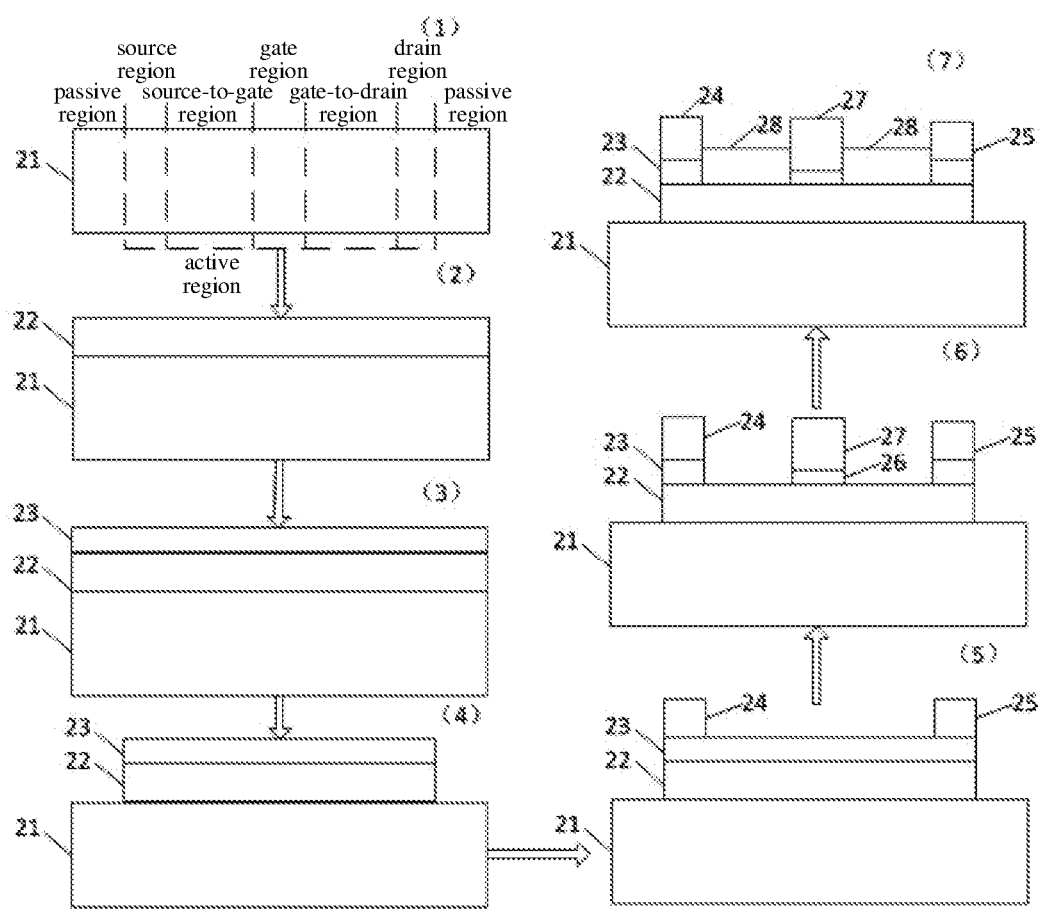
Figure 3:
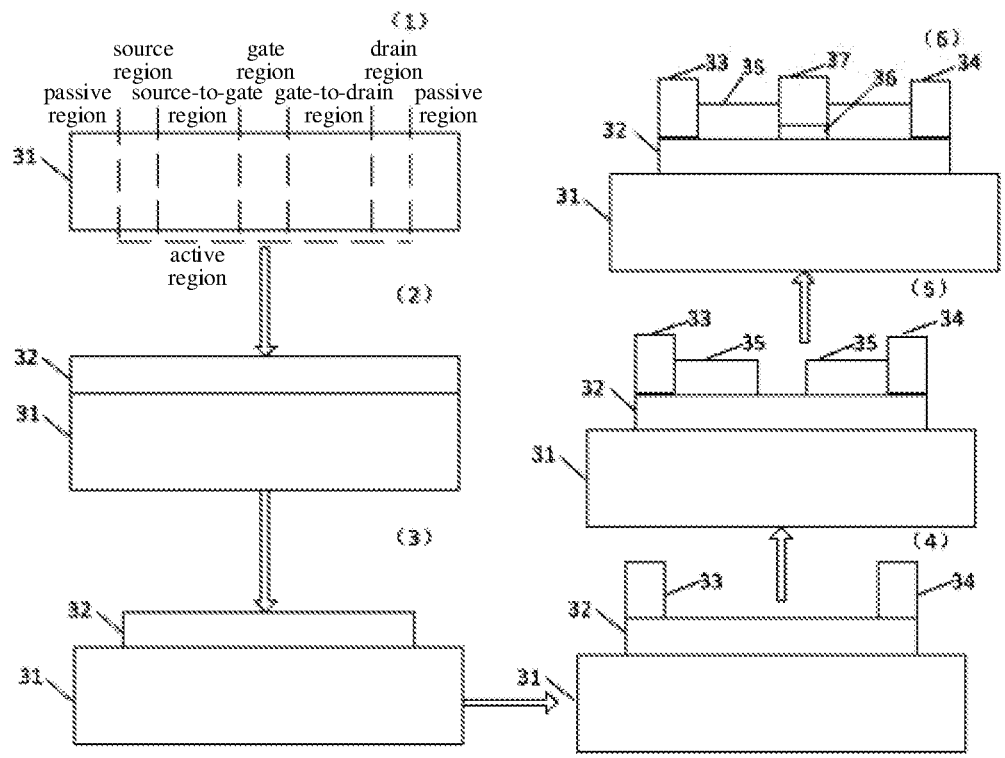
Figure 4:
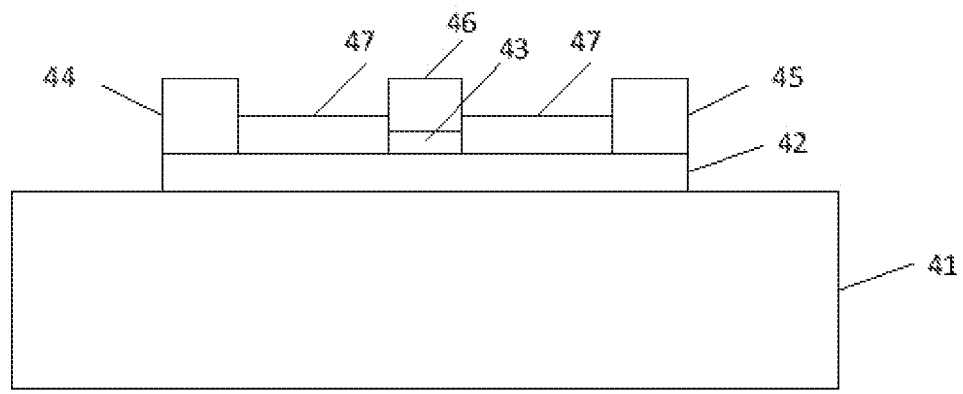

FIG. 1 is a schematic flowchart illustrating implementation of a method for preparing a diamond-based field effect transistor provided in a first embodiment of the disclosure;

FIG. 2 is a schematic diagram illustrating cross-sections involved in a method for preparing a diamond-based field effect transistor provided in a second embodiment of the disclosure;

FIG. 3 is a schematic diagram illustrating cross-sections involved in a method for preparing a diamond-based field effect transistor provided in a third embodiment of the disclosure;

FIG. 4 is a schematic diagram of a cross-section of a diamond-based field effect transistor provided in a fourth embodiment of the disclosure.

DETAILED DESCRIPTION

The disclosure will be further described in detail in combination with the embodiments and the drawings as follows to make the purpose, technical solutions and advantages of the disclosure understood better and more clearly. It should be understood that the detailed embodiments described here are merely used to explain rather than limit the disclosure.

Referring to FIG. 2 (1) and FIG. 3 (1), a diamond layer 21 is divided into an active region and a passive region. The active region refers to a mesa region which is also a region of preparing an active device, and the passive region is a region other than the active region. The active region is also divided into a source region, a gate region and a drain region; the source region and the drain region are located on two sides of the gate region. A source-to-gate region is a region between the source region and the gate region and a gate-to-drain region is a region between the drain region and the gate region.

First Embodiment

Referring to FIG. 1, a method for preparing a diamond-based field effect transistor includes operations S101 to S106.

In operation S101, a conductive layer is formed on an upper surface of the diamond layer that is a high-resistance layer.

In the embodiment of the disclosure, the conductive layer is a p-type conductive layer. Doped diamond is grown by epitaxial growth on the upper surface of the diamond layer as the conductive layer, herein dopant elements include but are not limited to hydrogen and boron, or the conductive layer is formed by implanting dopant ions, which include but are not limited to hydrogen ions and boron ions, on the diamond layer using ion implantation.

In operation S102, an active region mesa is manufactured on the diamond layer.

In the embodiment of the disclosure, the active region mesa is manufactured, and mesa isolation is implemented and devices are manufactured in mesa regions.

In operation S103, a source electrode is manufactured on a first region of the conductive layer corresponding to a source region and a drain electrode is manufactured on a second region of the conductive layer corresponding to a drain region.

In the embodiment of the disclosure, materials of the source electrode and the drain electrode include but are not limited to metals of Au, Pd, Sn, Pt, Ni and Ti or alloys composed of two or more of the above metals. The materials of the source electrode and the drain electrode can also be one or a combination of Ti, W, graphene, carbon black, amorphous carbon, carbon nano-tube, and can also be combined with an inert gas and then annealed to form an ohmic contact.

In operation S104, a photocatalyst dielectric layer is deposited on an upper surface of a third region of the conductive layer corresponding to a source-to-gate region and a photocatalyst dielectric layer is deposited on an upper surface of a fourth region of the conductive layer corresponding to a gate-to-drain region.

In the embodiment of the disclosure, materials of the photocatalyst dielectric layer include but are not limited to one or a combination of semiconductor materials with photocatalyst functions such as CuO, $TiO_2$, ZnO, CdS, $WO_3$. The catalyst dielectric layer can be deposited by physical vapor deposition, chemical vapor deposition or a sol-gel method.

In operation S105, the photocatalyst dielectric layers are illuminated by light.

In the embodiment of the disclosure, the light may be an ultraviolet light with a wavelength between 10 nm to 400 nm or a visible light with a wavelength between 400 nm to 760 nm.

In operation S106, a gate dielectric layer is deposited on a fifth region of the conductive layer corresponding to a gate region and a gate electrode is manufactured on an upper surface of the gate dielectric layer.

In the embodiment of the disclosure, materials of the gate dielectric layer include but are not limited to $Al_2O_3$, $Si_xN_y$, $Si_xO_y$, $MO_3$, $TiO_2$, ZnO, $WO_3$, $HfO_2$, AlN and BN. Gates include but are not limited to a T-shaped gate, a Y-shaped gate, a straight gate and a fin gate. Materials of the gate electrode include but are not limited to one or a combination of Al, Ni, Sn, Ti and W.

The operation S106 can be performed before the operation S104, and the operation S105 can be performed after the operation S106.

In the embodiments of the disclosure, a photocatalyst dielectric layer is deposited in a region between a source electrode and a gate electrode and a photocatalyst dielectric layer is deposited in a region between a drain electrode and the gate electrode. When the photocatalyst dielectric layers are illuminated, electrons in the valence band of the photocatalyst dielectric layers experience transition and then electrons and holes are generated; the electrons will combine with hydroxyls and water that are absorbed on a surface of the photocatalyst dielectric layer to form hydroxyl radicals and the dissolved oxygen on the surface of the photocatalyst dielectric layer will also capture the electrons and form superoxide anions, thus causing surplus holes in the photocatalyst dielectric layer; the surplus holes will cause transfer of the electrons in the hydrogen terminated diamond by attracting the electrons and neutralize the electrons. Such a process accelerates the transfer of the electrons at an interface between the a p-type conductive channel and the photocatalyst dielectric layer, thus ensures a steady and continuous supply of charges for the hydrogen terminated diamond and a much better performance of the p-type conductive channel Therefore, it is possible to reduce the on-resistance of the diamond-based field effect transistor.

Second Embodiment

Referring to FIG. 2, a method for preparing a diamond-based field effect transistor includes operations S201 to S207.

In operation 201, a conductive layer is formed on an upper surface of a diamond layer that is a high-resistance layer.

Referring to FIG. 2 (2), in the embodiment of the disclosure, the conductive layer 22 is formed on the diamond layer 21. With a microwave plasma chemical vapor deposition (MPCVD) device, the p-type conductive layer 22 is formed by processing the high-resistance diamond layer 21 by hydrogen plasma for 15 minutes and performing annealing in a hydrogen atmosphere at a temperature of 1000° C. for 20 minutes.

In operation S202, a first metal layer is deposited on an upper surface of the conductive layer.

Referring to FIG. 2 (3), in the embodiment of the disclosure, the first metal layer 23, which is palladium, is deposited on the upper surface of the conductive layer 22. The palladium with a thickness of 30 nm is formed on the upper surface of the p-type conductive layer 22 using an electron beam evaporation process.

In operation S203, photoresist is applied over a region of the first metal layer corresponding to an active region using a photolithography process; the first metal layer in a region corresponding to a passive region is removed using a corrosive liquid; the conductive layer in the region corresponding to the passive region is removed using an etching process; and the photoresist is removed.

Referring to FIG. 2 (4), in the embodiment of the disclosure, the conductive layer and the first metal layer corresponding to a passive region are removed. The detailed process includes the following operations: the conductive layer and the first metal layer corresponding to an active region are protected using photoresist to prevent the conductive layer and the first metal layer, which correspond to the active region, from being removed in the subsequent processes. The palladium corresponding to the passive region is removed firstly using the corrosive liquid $KI/I_2$ and then the device is etched for 3 minutes using oxygen plasma, the conductive layer corresponding to the passive region is removed and the photoresist is removed finally, thus forming a mesa region to implement mesa isolation.

In operation S204, the photoresist is applied over a region of the first metal layer other than regions corresponding to the source region and corresponding to the drain region; a second metal layer is deposited on an upper surface of a region of the first metal layer corresponding to the source region to form the source electrode, and the second metal layer is deposited on an upper surface of a region of the first metal layer corresponding to the drain region to form the drain electrode; and the photoresist is removed.

Referring to FIG. 2 (5), in the embodiment of the disclosure, the source electrode 24 and the drain electrode 25 are manufactured on the conductive layer. The detailed process includes the following operations: the photoresist is applied over the upper surfaces of the first metal layers corresponding to a source-to-gate region, a gate-to-drain region, the source region and the passive region to expose the first metal layers corresponding to the source region and the drain regions, and then Ti with a thickness of 50 nm, Pt with a thickness of 50 nm and Au with a thickness of 100 nm are deposited in sequence on regions of the first metal layer corresponding to the source region and corresponding to the drain region respectively using an electron beam evaporation process, and the photoresist is stripped using stripping liquid to form the source electrode 24 and the drain electrode 25 finally. The source electrode 24 is the first metal layer and the second metal layer corresponding to the source region, and the drain electrode 25 is the first metal layer and the second metal layer corresponding to the drain region.

In operation 205, the first metal layer in regions corresponding to the source-to-gate region, the gate region and the gate-to-drain region is removed; the gate dielectric layer is deposited on an upper surface of a fifth region of the conductive layer; and a third metal layer is deposited on an upper surface of the gate dielectric layer to form the gate electrode.

Referring to FIG. 2 (6), in the embodiment of the disclosure, the gate dielectric layer 26 is deposited on a region of the conductive layer 22 corresponding to the gate region, and the third metal layer is deposited on the upper surface of the gate dielectric layer 26 to form the gate electrode 27. The detailed process includes the following operations: the photoresist is applied over an upper surface of the source electrode, an upper surface of the drain surface and an upper surface of the passive region of the diamond layer, and the first metal layer in regions corresponding to the source-to-gate region, the gate region and the gate-to-drain region is removed using the corrosive liquid $KI/I_2$ and the photoresist is removed. The photoresist is applied over a region of the conductive layer other than the fifth region to expose the fifth region, and the gate dielectric layer 26 is deposited on the upper surface of the fifth region of the conductive layer, and the gate electrode 27 is formed by vapor deposition of Ti with a thickness of 50 nm and Au with a thickness of 100 nm in sequence using an electron beam evaporation device and stripping the photoresist.

In operation S206, the photocatalyst dielectric layer is deposited; photoresist is applied over both regions of the photocatalyst dielectric layer corresponding to the source-to-gate region and corresponding to the gate-to-drain region; the photocatalyst dielectric layer in regions corresponding to the source region, the drain region, the gate region and the passive region is removed respectively; and the photoresist is removed.

Referring to FIG. 2 (7), in the embodiment of the disclosure, the photocatalyst dielectric layer 27 is deposited in regions of the conductive layer corresponding to the source-to-gate region and the gate-to-drain region. The detailed process includes the following operations: a thin film of CuO with a thickness of 3 nm is deposited on a surface of a device as the photocatalyst dielectric layer using an atom layer deposition (ALD) device. In other words, the thin film of CuO is deposited on an upper surface of a third region of the conductive layer, an upper surface of a fourth region of the conductive layer, the upper surface of the source electrode, the upper surface of the gate electrode, the upper surface of the drain electrode and the upper surface of the passive region of the diamond layer; CuO in the regions corresponding to the source-to-gate region and to the gate-to-drain region is protected by the photoresist; CuO in the regions corresponding to the source region, the drain region, the gate region and the passive region is removed using the corrosive liquid; and the photoresist is stripped finally.

In operation S207, the photocatalyst dielectric layers are illuminated by light.

In the embodiment of the disclosure, illumination by ultraviolet light with a wavelength of 325 nm for ten minutes activates separation of electrons from holes. So far, manufacturing of the device ends.

Third Embodiment

Referring to FIG. 3, a method for preparing a diamond-based field effect transistor includes operations S301 to S306.

In operation S301, a conductive layer is formed on an upper surface of a diamond layer that is a high-resistance layer.

Referring to FIG. 3(2), in the embodiment of the disclosure, the conductive layer 32 is formed on the diamond layer 31. With a MPCVD device, the p-type conductive layer 32 is formed by processing the high-resistance diamond layer 31 by hydrogen plasma for 10 minutes and performing annealing in a hydrogen atmosphere at a temperature of 800° C. for 1 hour.

In operation S302, photoresist is applied over a region of the conductive layer corresponding to an active region; the conductive layer in a region corresponding to a passive region is removed to form an active region mesa; and the photoresist is removed.

Referring to the FIG. 3 (3), in the embodiment of the disclosure, the conductive layer corresponding to the passive region is removed. The detailed process includes the following operations: the conductive layer corresponding to the active region is protected by photoresist, and etching is performed using an oxygen plasma etching device to remove the conductive layer in the passive region, and photoresist is stripped finally, thus forming the active region mesa to implement mesa isolation.

In operation S303, the photoresist is applied over a region other than the first region and the second region using a photolithography process; a second metal layer is deposited on an upper surface of the first region to form a source electrode and on an upper surface of the second region to form a drain electrode; the photoresist is removed; an annealing process is used to form an ohmic contact between the conductive layer corresponding to a source region and the second metal layer and an ohmic contact between the conductive layer corresponding to a drain region and the second metal layer.

Referring to FIG. 3 (4), in the embodiment of the disclosure, firstly, the source electrode and the drain region are formed using the photolithography process, namely, a region of the conductive layer other than the first region and the second region is protected by the photoresist, in other words, the photoresist is applied over the passive region of the diamond layer, and a third region, a fourth region and a fifth region of the conductive layer; and then Ti with a thickness of 50 nm, Pt with a thickness of 50 nm and Au with a thickness of 100 nm are deposited using an electron beam evaporation process respectively, and the photoresist is removed using stripping liquid; finally an annealing process is performed in an Ar atmosphere at a temperature of 1000° C. for 10 minutes to form an ohmic contact. So far, the source electrode 33 and the drain electrode 34 are manufactured.

In operation S304, a photocatalyst dielectric layer is deposited on the upper surface of the third region of the conductive layer and on the upper surface of the fourth region of the conductive layer.

Referring to FIG. 3(5), in the embodiment of the disclosure, the photoresist is applied over a region other than the third region and the fourth region to expose the third region and the fourth region of the conductive layer; a thin film of metal Ti with a thickness of 2 nm is deposited using the electron beam evaporation device and a thin film of $TiO_2$ is formed as the photocatalyst dielectric layer after a natural oxidation of the Ti thin film in the air; finally photoresist is stripped. So far, the photocatalyst dielectric layer 35 is manufactured.

In operation S305, the photocatalyst dielectric layers are illuminated by light.

In the embodiment of the disclosure, separation of electrons from holes is activated by illumination by ultraviolet light with a wavelength of 266 nm for ten minutes.

In operation S306, the photoresist is applied over a region of the conductive layer other than the fifth region of the conductive layer corresponding to the gate region; a gate dielectric layer is deposited on the fifth region; a third metal layer is deposited on the gate dielectric layer; and the photoresist is removed.

Referring to FIG. 3 (6), in the embodiment of the disclosure, the gate electrode is formed using the photolithography process; the photoresist is applied over a region other than the fifth region to expose the fifth region; the gate dielectric layer 36 is deposited; and deposition of metal Al with a thickness of 150 nm and Au with a thickness of 1000 nm as the gate electrode 37 is performed in sequence using the electron beam evaporation device. So far, manufacturing of the device ends.

It is to be understood that, in each embodiment of the disclosure, operations are not necessarily performed according to a sequence defined by their respective sequence numbers. The execution sequence of each process should be determined according to its function and an internal logic, and is not intended to limit the embodiments of the disclosure in any way.

Fourth Embodiment

Referring to FIG. 4, a diamond-based field effect transistor includes a high-resistance diamond substrate 41, a conductive layer 42, a gate dielectric layer 43, a source electrode 44, a drain electrode 45 and a gate electrode 46, an upper surface of the high-resistance diamond substrate 41 being covered with the conductive layer 42, an upper surface of the conductive layer 42 being provided with the source electrode 44, the drain electrode 45 and the gate electrode 46, the gate dielectric layer 43 being disposed between the gate electrode 46 and the conductive layer 42; a photocatalyst dielectric layer 47 is provided on a region of the conductive layer between the source electrode 44 and the gate electrode 46 and on a region of the conductive layer between the drain electrode 45 and the gate electrode 46.

The above-mentioned is merely preferred embodiments of the disclosure and is not intended to limit the disclosure. Any modification, equivalent substitution and improvement and the like which do not depart from the spirit and the scope of the disclosure should all fall within the scope of the protection of the disclosure.

The invention claimed is:

1. A method for preparing a diamond-based field effect transistor, comprising:
    forming a conductive layer on an upper surface of a diamond layer, wherein the diamond layer is a high-resistance layer;
    manufacturing an active region mesa on the diamond layer;
    manufacturing a source electrode on a first region of the conductive layer corresponding to a source region;
    manufacturing a drain electrode on a second region of the conductive layer corresponding to a drain region;
    depositing a photocatalyst dielectric layer on an upper surface of a third region of the conductive layer corresponding to a source-to-gate region;
    depositing a photocatalyst dielectric layer on an upper surface of a fourth region of the conductive layer corresponding to a gate-to-drain region;
    illuminating the photocatalyst dielectric layers; and
    depositing a gate dielectric layer on a fifth region of the conductive layer corresponding to a gate region and manufacturing a gate electrode on an upper surface of the gate dielectric layer.

2. The method for preparing a diamond-based field effect transistor according to claim 1, further comprising: before manufacturing the active region mesa on the diamond layer,
    depositing a first metal layer on an upper surface of the conductive layer.

3. The method for preparing a diamond-based field effect transistor according to claim 2, wherein manufacturing the active region mesa on the diamond layer specifically comprises:
    applying photoresist over a region of the first metal layer corresponding to an active region using a photolithography process;
    removing the first metal layer in a region corresponding to a passive region using a corrosive liquid;
    removing the conductive layer in the region corresponding to the passive region using an etching process; and
    removing the photoresist.

4. The method for preparing a diamond-based field effect transistor according to claim 3, wherein manufacturing the source electrode on the first region of the conductive layer corresponding to the source region and manufacturing the drain electrode on the second region of the conductive layer corresponding to the drain region comprises:
    applying the photoresist over a region of the first metal layer other than regions corresponding to the source region and the drain region;
    depositing a second metal layer on an upper surface of a region of the first metal layer corresponding to the source region to form the source electrode, and depositing the second metal layer on an upper surface of a region of the first metal layer corresponding to the drain region to form the drain electrode; and removing the photoresist.

5. The method for preparing a diamond-based field effect transistor according to claim 4, wherein depositing the gate dielectric layer on the fifth region of the conductive layer corresponding to the gate region is performed before depositing the photocatalyst dielectric layer on the upper surface of the third region of the conductive layer corresponding to the source-to-gate region; and wherein depositing the gate dielectric layer on the fifth region of the conductive layer corresponding to the gate region and manufacturing the gate electrode on the upper surface of the gate dielectric layer specifically comprises:

removing the first metal layer in regions corresponding to the source-to-gate region, the gate region and the gate-to-drain region;

depositing the gate dielectric layer on an upper surface of the fifth region of the conductive layer; and depositing a third metal layer on an upper surface of the gate dielectric layer to form the gate electrode.

6. The method for preparing a diamond-based field effect transistor according to claim 5, wherein depositing the photocatalyst dielectric layer on the upper surface of the third region of the conductive layer corresponding to the source-to-gate region and depositing the photocatalyst dielectric layer on the upper surface of the fourth region of the conductive layer corresponding to the gate-to-drain region specifically comprises:

depositing the photocatalyst dielectric layer;

applying photoresist over both regions of the photocatalyst dielectric layer corresponding to the source-to-gate region and corresponding to the gate-to-drain region;

removing respectively the photocatalyst dielectric layer in regions corresponding to the source region, the drain region, the gate region and the passive region; and removing the photoresist.

7. The method for preparing a diamond-based field effect transistor according to claim 1, wherein manufacturing the active region mesa on the diamond layer specifically comprises:

applying photoresist over a region of the conductive layer corresponding to the active region;

removing the conductive layer in a region corresponding to a passive region to form the active region mesa; and removing the photoresist.

8. The method for preparing a diamond-based field effect transistor according to claim 1, wherein manufacturing the source electrode on the first region of the conductive layer corresponding to the source region and manufacturing the drain electrode on the second region of the conductive layer corresponding to the drain region specifically comprises:

applying photoresist over a region other than the first region and the second region using a photolithography process;

depositing a second metal layer on the upper surface of the first region to form the source electrode and depositing the second metal layer on the upper surface of the second region to form the drain electrode;

removing the photoresist; and using an annealing process to form an ohmic contact between the conductive layer corresponding to the source region and the second metal layer and an ohmic contact between the conductive layer corresponding to the drain region and the second metal layer.

9. The method for preparing a diamond-based field effect transistor according to claim 1, wherein depositing the gate dielectric layer on the fifth region of the conductive layer corresponding to the gate region and manufacturing the gate electrode on the upper surface of the gate dielectric layer specifically comprises:

applying photoresist over a region of the conductive layer other than the fifth region;

depositing the gate dielectric layer on an upper surface of the fifth region;

depositing a third metal layer on the upper surface of the gate dielectric layer; and removing the photoresist.

10. A diamond-based field effect transistor, comprising a high-resistance diamond substrate, a conductive layer, a gate dielectric layer, a source electrode, a drain electrode and a gate electrode, an upper surface of the high-resistance diamond substrate being covered with the conductive layer, an upper surface of the conductive layer being provided with the source electrode, the drain electrode and the gate electrode, the gate dielectric layer being disposed between the gate electrode and the conductive layer, wherein a photocatalyst dielectric layer is provided on a region of the conductive layer between the source electrode and the gate electrode and on a region of the conductive layer between the drain electrode and the gate electrode.

* * * * *